(12) United States Patent
Karpov et al.

(10) Patent No.: US 9,021,227 B2
(45) Date of Patent: Apr. 28, 2015

(54) DRIFT MANAGEMENT IN A PHASE CHANGE MEMORY AND SWITCH (PCMS) MEMORY DEVICE

(75) Inventors: Elijah V. Karpov, Santa Clara, CA (US); Gianpaolo Spadini, Campbell, CA (US)

(73) Assignee: Intel Corporation, Santa Clara, CA (US)

( * ) Notice: Subject to any disclaimer, the term of this patent is extended or adjusted under 35 U.S.C. 154(b) by 932 days.

(21) Appl. No.: 13/166,214

(22) Filed: Jun. 22, 2011

(65) Prior Publication Data

US 2012/0331204 A1    Dec. 27, 2012

(51) Int. Cl.
G06F 12/02    (2006.01)
G11C 13/00    (2006.01)

(52) U.S. Cl.
CPC .......... *G11C 13/0004* (2013.01); *G11C 13/003* (2013.01); *G11C 13/0061* (2013.01); *G11C 13/0069* (2013.01); *G11C 2213/76* (2013.01)

(58) Field of Classification Search
CPC .. G11C 13/0009; G11C 13/02; G11C 13/003; G11C 13/0061; G11C 13/0069; G11C 13/0004; G06F 12/0246
USPC .................. 711/103, E12.02, 167
See application file for complete search history.

(56) References Cited

U.S. PATENT DOCUMENTS

| | | | |
|---|---|---|---|
| 8,843,698 B2 * | 9/2014 | Weingarten et al. .......... 711/103 |
| 2007/0297221 A1 | 12/2007 | Philipp et al. | |
| 2009/0016099 A1 * | 1/2009 | Jeong et al. ................... 365/163 |
| 2009/0040816 A1 | 2/2009 | Kang et al. | |
| 2010/0259998 A1 | 10/2010 | Kwon et al. | |

FOREIGN PATENT DOCUMENTS

| | | |
|---|---|---|
| KR | 1020080081656 A | 9/2008 |
| WO | 2012177698 A2 | 12/2012 |
| WO | 2012/177698 A3 | 3/2013 |
| WO | WO2013095385 A1 * | 6/2013 .............. G06F 12/02 |

OTHER PUBLICATIONS

Papandreou, N. et al, "Drift-Tolerant Multilevel Phase-Change Memory", 3rd IEEE International Memory Workshop (IMW), May 22-25, 2011.*
Papandreou et al. "Programming Algorithms for Multilevel Phase-Change Memory", IEEE International Symposium on Circuits and Systems (ISCAS), pp. 329-332, May 15-18, 2011.*
Wangyuan Zhang et al, "Helmet: A Resistance Drift Resilient Architecture for Multi-Level Cell Phase Change Memory System", IEEE/IFIP 41st International Conference on Dependable Systems & networks, pp. 197-208, Jun. 27-30, 2011.*

(Continued)

*Primary Examiner* — Pierre-Michel Bataille
(74) *Attorney, Agent, or Firm* — Alpine Technology Law Group LLC

(57) ABSTRACT

The present disclosure relates to the drift management for a memory device. In at least one embodiment, the memory device of the present disclosure may include a phase change memory and switch (hereinafter "PCMS") memory cell and a memory controller that is capable of implementing drift management to control drift. Other embodiments are described and claimed.

18 Claims, 7 Drawing Sheets

(56) References Cited

OTHER PUBLICATIONS

Papandreou et al, "Drift-Tolerant Multilevel Phase-Change Memory", IEEE 3rd International Conference on Memory Workshop (IMW), pp. 1-4, May 22-25, 2011.*

International Search Report and Written Opinion received for International Application No. PCT/US2012/043249, mailed on Jan. 14, 2013, 9 Pages.

International Preliminary Report and Written Opinion received for International Application No. PCT/US2012/043249, mailed on Jan. 9, 2013.

Office Action Received for Taiwanese Patent Application 101119330, mailed on Dec. 15, 2014, 8 pages including 3 pages of English Translation.

* cited by examiner

DRIFT MANAGEMENT IN A PHASE CHANGE MEMORY AND SWITCH (PCMS) MEMORY DEVICE

BACKGROUND

The subject matter of the present disclosure relates generally to a phase change memory and switch (PCMS) memory and, particularly, to method and apparatus to manage drift in a PCMS memory device.

Phase change memory (PCM) devices use phase change materials which are materials that may be electrically switched between a generally amorphous and a generally crystalline state, as an electronic memory. Typical PCM materials used for memory applications include multi-component chalcogenides, such as $Ge_2Sb_2Te_5$ (GST), which undergo reversible and rapid amorphous-to-crystalline phase change under an electrical field. The markedly different amorphous and crystalline state resistances are used as the two memory states, "0" (RESET) and "1" (SET). The state of a phase change material is also non-volatile. Therefore, when the memory is set in a state representing a resistance value, that value is retained until reprogrammed, even if power is turned off. A scalable and stackable non-volatile PCMS device can be built from memory cells by layering a PCM storage element and an Ovonic threshold switch (OTS). These vertically integrated memory cells can be embedded in a cross-point array stacked on top of a CMOS circuit for decoding, sensing, and logic function. PCM materials are known to show spontaneous changes, or drift, in the measurable device parameters (such as threshold voltage and resistance) used for recording and reading the PCM information. Therefore, drift management is a consideration for a PCMS memory device.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
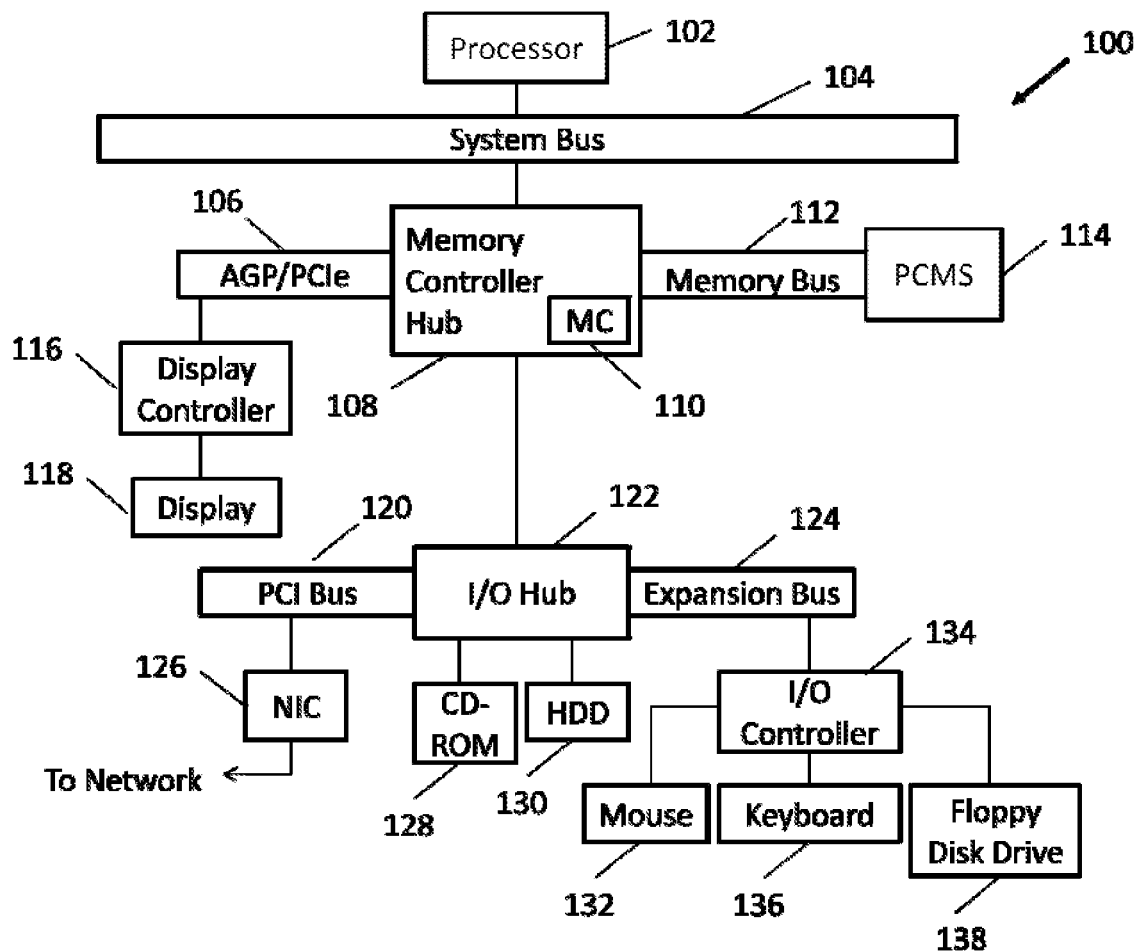
FIG. 1 is a schematic diagram showing a computing system utilizing drift management of a phase change device in accordance with one or more embodiments.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the claimed subject matter. Therefore, the use of the phrase "one embodiment" or "in an embodiment" does not necessarily refer to the same embodiment. In addition, it is to be understood that the location or arrangement of individual elements within one or more of the disclosed embodiments may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

FIG. 1 shows a computing system 100 according to at least one embodiment of the claimed subject matter. Computing system 100 may be used in a variety of portable electronic systems such as, a portable communication device, a two-way communication system, a tablet computer, a personal communication system (PCS), a portable computer, a personal digital assistant (PDA), or the like, although the scope and application of the claimed subject matter is not limited to these examples. Other applications where the claimed subject matter may be used are non-portable electronic applications, such as in base stations, servers, or desktop computers.

Computing system 100 may comprise a processor 102 that is connected to a system bus 104. Although the scope of the claimed subject matter is not limited in this respect, processor 102 may comprise, for example, a microprocessor, a digital signal processor, a microcontroller, or the like. Computing system 100 may further include a memory controller hub 108 and a display controller 116 coupled to memory controller hub 108 by an accelerated graphics port (AGP) or a peripheral component interconnect express (PCIe) bus 106. Display controller 116 may generate signals to control a display 118.

Memory controller hub 108 may also be coupled to an input/output (I/O) hub 122. I/O hub 122 may control operation of a compact disk read-only memory (CD-ROM) drive 128 and a hard disk drive (HDD) 130. In addition, I/O hub 122 may provide interface to a peripheral component interconnect (PCI) bus 120 and an expansion bus 124. PCI bus 120 may be connected to a network interface card (NIC) 126. I/O controller 134 may be connected to expansion bus 124 and may control operation of a floppy disk drive 138. In addition, I/O controller 134 may receive input signals from a mouse 132 and a keyboard 136. The scope and application of the claimed subject matter is not limited by the specific elements and integration scheme discussed above. For example, in a different embodiment a touch screen monitor, instead of keyboard 136 and mouse 132, may be used to generate input signals.

Computing system 100 may also include a PCMS memory 114 coupled to memory controller hub 108 via a memory bus 112. Memory controller hub 108 may include a memory controller (MC) 110 which generates control signals, address signals, and data signals that may be associated with a particular write or read operation to PCMS 114. Memory bus 112 may include communication lines for communicating data to and from PCMS 114 as well as control and address lines used to store and retrieve data to and from PCMS 114. In another embodiment, MC 110 may be integrated into processor 102 to enhance performance.

Figure 2:
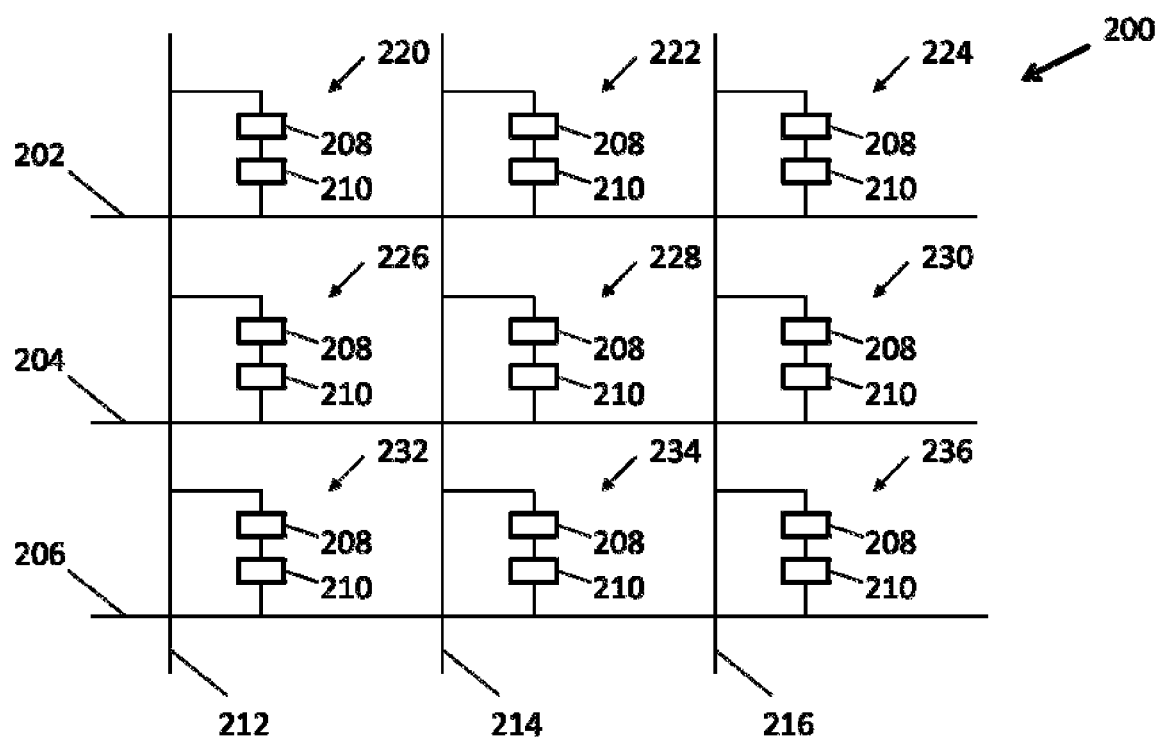
FIG. 2 is a schematic diagram showing a phase change memory and switch memory array in accordance with one or more embodiments.
Figure 3:
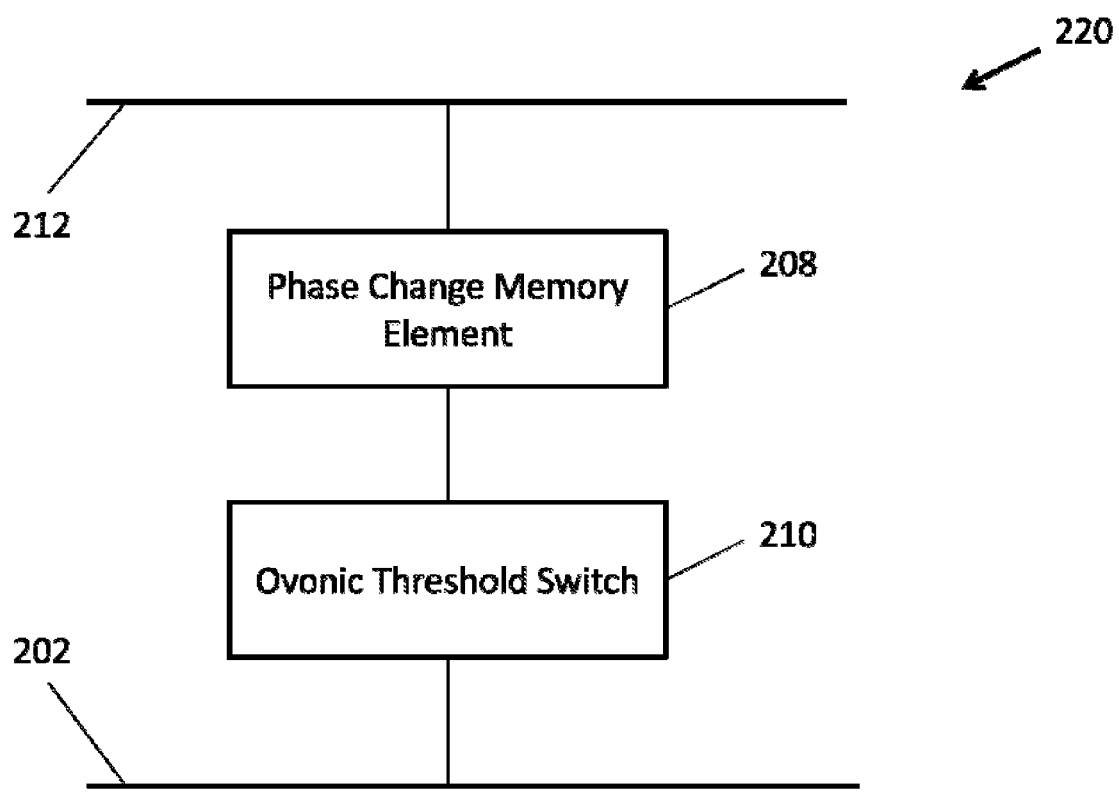
FIG. 3 is a schematic diagram showing a phase change memory element and an Ovonic threshold switch within a memory cell in accordance with one or more embodiments.

FIG. 2 shows a PCMS memory array 200 comprising, for illustration purposes, a 3×3 array of memory cells 220-236. FIG. 3 shows a PCMS memory cell 220 (analogous to any of memory cells 220-236 of FIG. 2). One or more memory cell 220 may include a PCM element 208 and an OTS 210.

Memory array 200 may include column lines 212, 214, and 216 and row lines 202, 204, and 206 to select a particular memory cell of the array during a write or read operation. The column lines 212, 214, and 216 and the row lines 202, 204, and 206 may also be referred to as "address lines" since these lines may be used to address memory cells 220-236 during writing (programming) or reading. The column lines 212, 214, and 216 may also be referred to as "bit lines", and the row lines 202, 204, and 206 may also be referred to as "word lines".

The PCM elements 208 may be connected to the column lines 212, 214, and 216 and may be coupled to the row lines 202, 204, and 206 through the OTS 210. One or more OTSs 210 may be connected in series to one or more PCM elements 208 and may be used to access one or more PCM elements 208 during writing or reading. When a particular memory cell (for example, memory cell 232 of FIG. 2) is selected, a voltage potential is applied to its associated column line (for example, element 212 of FIG. 2) and row line (for example, element 206 of FIG. 2). It is understood that one or more OTSs 210 may be positioned between one or more PCM elements 208 and the row lines 202, 204, and 206 with one or more PCM elements 208 coupled to the column lines 212, 214, and 216. It is also understood that more than one OTS 210 may be used within one or more memory cells 220-236.

Figure 4:
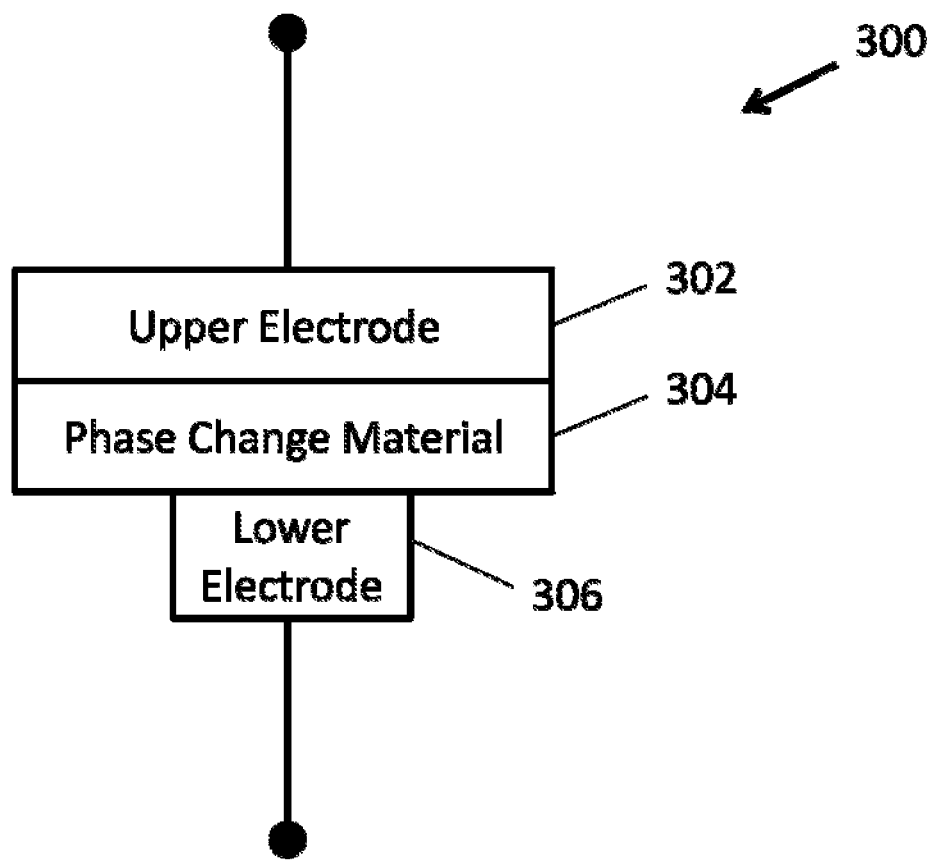
FIG. 4 is a schematic diagram showing physical elements within a phase change memory element in accordance with one or more embodiments.

FIG. 4 shows one embodiment of a PCM element 300 according to the present description. The PCM element 300 operates based on the phase changing properties of a phase change material 304, which is interposed between an upper electrode 302 and a lower electrode 306. As a current is applied, the phase change material 304 undergoes a phase change due to the heat generated by the electrodes (302 and 306) and/or by the phase change material 304 (by the Joule effect) itself.

A phase change material is a material having electrical properties (for example, resistance) that may be changed through the application of energy such as, heat, light, voltage potential, or electrical current. Examples of phase change materials include, but are not limited to, Ovonic materials and chalcogenide materials. An Ovonic material is a material that undergoes electronic or structural changes and acts as a semiconductor once subjected to a voltage potential, electrical current, light, heat, etc. A chalcogenide material is a material that includes at least one element (e.g., tellurium (Te), sulfur (S), or selenium (Se)) from Group 16 of the periodic table (IUPAC numbering), usually combined with Group 14 and Group 15 elements (for example, germanium (Ge), arsenic (As), or antimony (Sb)). Ovonic and chalcogenide materials may be non-volatile memory materials. In one embodiment, the phase change material 304 may be a chalcogenide material having a composition from the class of germanium-antimony-tellurium ($Ge_xSb_yTe_z$) or a GeSbTe alloy, although the scope of this invention is not limited to just these materials.

PCMS memory cell may be programmed or written into one of the two (SET or RESET) memory states by applying an electrical pulse to the cell. The electrical pulse may change the crystallinity of the PCM material between a substantially crystalline state and a substantially amorphous state due to heating. SET state and RESET state are delineated by the SET threshold voltage (SET $V_T$) and RESET threshold voltage (RESET $V_T$). The SET $V_T$ is lower than the RESET $V_T$. For example, for a PCMS memory cell, a RESET $V_T$ may be 7 volts and a SET $V_T$ may be 4 volts. To program a RESET state from a SET state, an electrical pulse is applied to a PCMS cell and due to the heat generated by the electrical current, the PCM material melts. After the electrical pulse is turned off, the melted material cools down and freezes in the two-to-three orders more resistive and amorphous RESET state. To program s SET state from a RESET state, an electrical pulse is applied to a PCMS cell which causes at least some of the amorphous RESET phase to re-crystallize and form a less resistive SET state.

By way of example, in a binary system storing one bit of data, a first state may be defined as the "1" state or SET state and a second state may be defined as the "0" state or the RESET state. The state to which a PCMS memory cell is programmed is determined by sensing its $V_T$. As mentioned above, the SET state corresponds to a lower $V_T$ and the RESET state to a higher $V_T$. The difference between RESET $V_T$ and SET $V_T$ represents the dynamic range for memory switching. A reasonable dynamic range, such as one volt, delineating SET vs. RESET state is desirable. Due to slight variations in composition and process, a distribution of SET $V_T$ and RESET $V_T$ normally exists within a memory block which consists of multiple memory bits, such as 1 million bits (1 MB).

To ascertain the state of a selected memory cell, a READ access bias is applied to the selected column and zero voltage is applied to the selected row. This access bias must be higher than the highest SET $V_T$ but lower than the RESET $V_T$. All or nearly all the unselected rows and columns may be biased at the same or nearly the same voltage to reduce background leakage current. If the PCMS memory cell is in a SET state, it will display a higher current condition to a sense amplifier. If the PCMS memory cell is in a RESET state, it will display a lower current condition to a sense amplifier.

PCM materials are known to show temporal drift of device parameters. The drift phenomena have practical implications because they result in spontaneous change in the measurable device parameters (such as resistance) used for recording and reading the PCMS information. As discussed above, $V_T$ in PCMS is measured to discriminate two memory states, "1" and "0". Due to the drift phenomena, $V_T$ in PCMS cell increases with time and as a result, several consequences may occur in a PCMS memory device:

(1) A RESET bit just written into a memory block where some SET bits were written a long time ago can have a RESET $V_T$ too close to $V_T$ of these SET bits. This is because $V_T$ of the SET bits has drifted higher with time. As a result, a state of these bits may not be detected correctly.

(2) A SET bit just written into the block where some RESET bits were written a long time ago can have $V_T$ too low to provide a proper blocking capability. That is, unselected bits may not be blocked properly and are turned on accidentally by the bias voltage when a target cell is selected. As a result, programming of the selected bit from RESET to SET may be compromised.

(3) After long time, RESET $V_T$ may drift to a higher voltage than the maximum capability of the device.

Accordingly, a method for drift management based on instructions executed by a memory controller may be involved to enhance the reliability of a PCMS memory device. To manage drift, the time when the first SET or RESET bit is written in a first memory block is stored as a SET reference time or a RESET reference time for that memory block. Whether the memory controller will allow or deny subsequent data storage by writing SET or RESET bits in the same memory block depends on the lapse of time since the reference time. If the time lapse is less than a preset time, for example, 8 decades of time (say from 10 ms to 10E5 s), writing SET or RESET bits in the first memory block may be allowed. However, if the time lapse is equal to or greater than the preset time, writing SET or RESET bits in the first memory block may be denied and SET or RESET bits have to be written in a second memory block for which the time lapse is less than the preset time. Also, in that case existing data in the first memory block will be transferred to the second or another memory block and the first memory block is then marked free. A preset time can be decided in advance to be the allowable amount of time for drift to occur since the reference time. Because the amount of change in device parameters due to drift is a function of time and with the above drift management method, such change is predictable and controllable. Therefore, performance of a PCMS memory device may be greatly improved with a drift management method. In order to reduce or minimize the impact to the write speed, all information to be written into memory bits can be at least temporarily stored in a buffer while drift management instructions are being executed by the memory controller.

Figure 5:
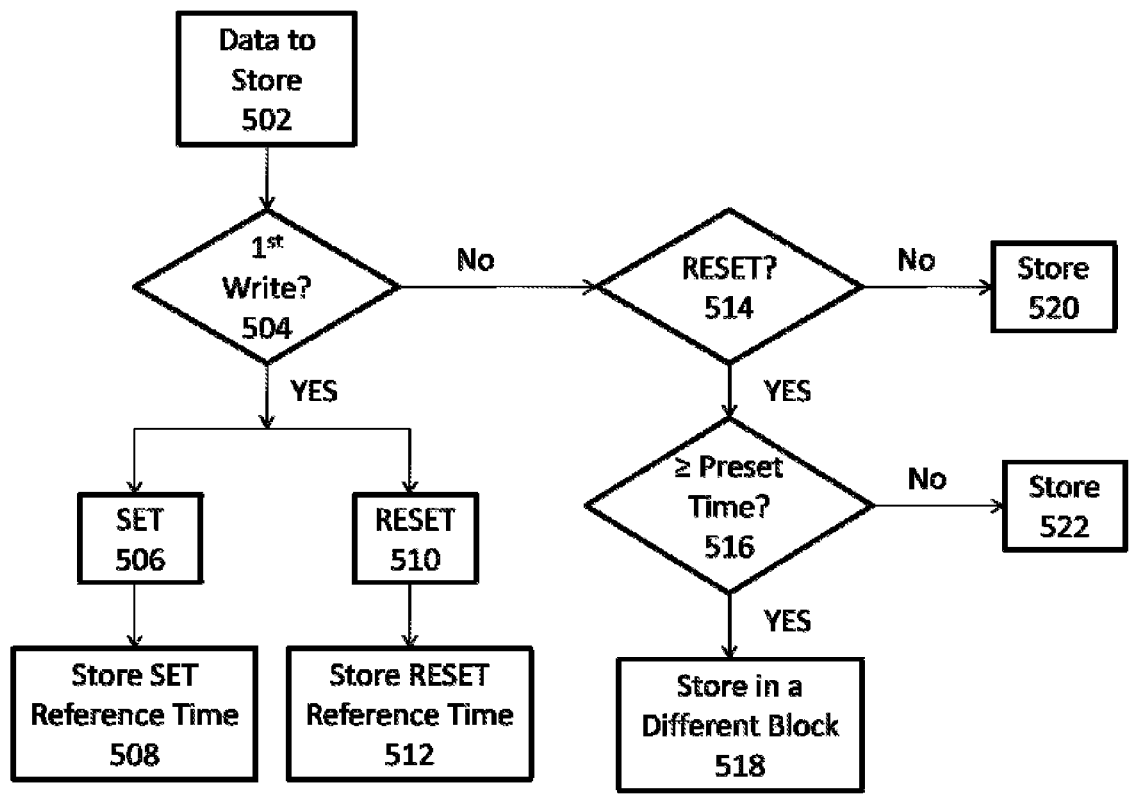
FIG. 5 is a diagram illustrating a drift management method that may be used to maintain read window in accordance with one or more embodiments.

FIG. 5 shows one embodiment of a drift management method that may be used to maintain read window in a PCMS memory device according to the present description. When information is to be stored in a memory bit (operation 502), a drift management method is executed as shown in operation 504 to decide if it is the first write ever performed to the entire memory block where the bit resides. If the answer is yes, the time when such operation, either writing a SET or a RESET state, is performed should be recorded as a SET or RESET reference time for this memory block (operations 508 and 512). If the answer is no and the operation is to write a SET state into a memory bit in the same memory block, the information will be stored (operation 520). If the answer is no and the operation is to write a RESET state into a memory bit (operation 516) in the same memory block, the lapse of time since the SET reference time will be compared to a preset time. If the time lapse is less than the preset time, the information will be stored as indicated in operation 522. If the time lapse is equal to or greater than the preset time, the information will be written into a memory bit in a different memory block for which the time lapse is less than the preset time (operation 518). With such method, the maximum amount of time during which $V_T$ of a SET bit may drift (to a higher voltage) is limited to the preset time. Therefore, although the read window, as characterized by the difference of $V_T$ between the RESET state and the SET state at time 0, may be reduced due to drift, the amount of reduction is predictable and controllable when a drift management method is utilized.

Figure 6:
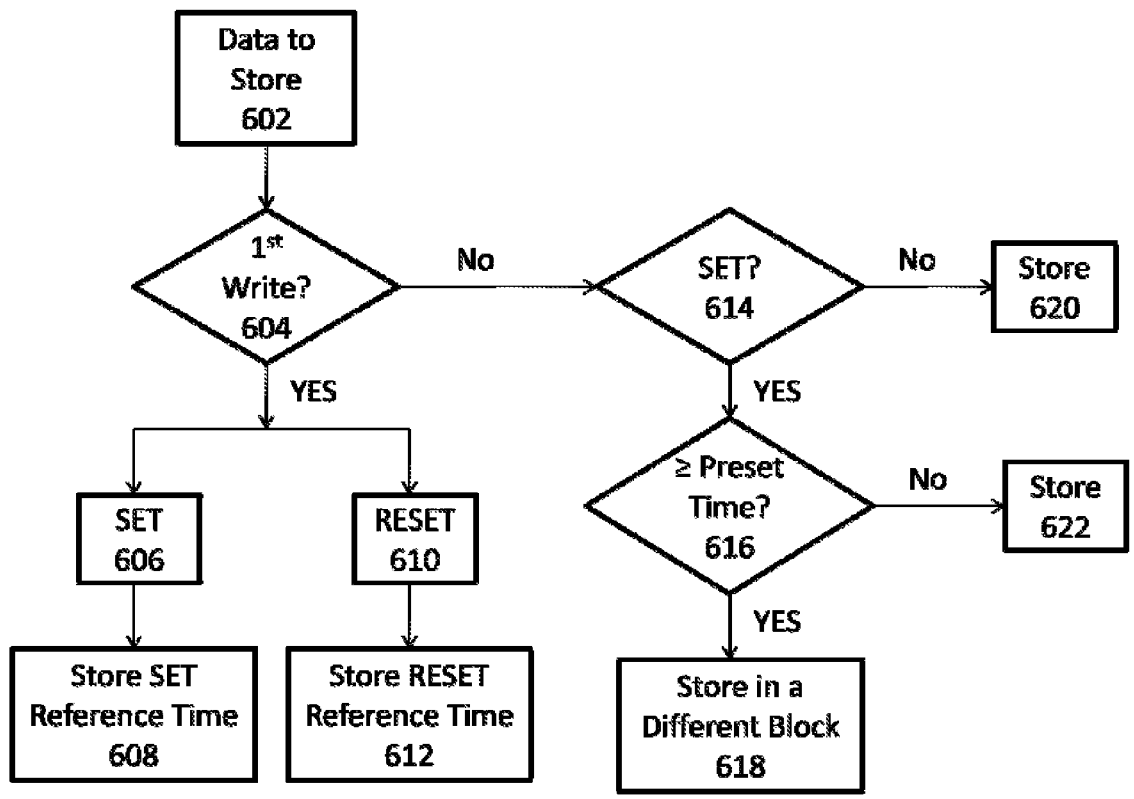
FIG. 6 is a diagram illustrating a drift management method that may be used to maintain write blocking in accordance with one or more embodiments.

FIG. 6 shows one embodiment of a drift management method that may be used to maintain write blocking according to the present description. When information is to be stored in a PCMS memory bit (operation 602), a drift management method is executed as indicated in operation 604 to decide if it is the first write ever performed to the entire memory block where the memory bit resides. If the answer is yes, the time when such operation, either writing a SET or a RESET state, is performed should be recorded as a SET or RESET reference time for this memory block (operations 608 and 612). If the answer is no and the operation is to write a RESET state into a memory bit in the same memory block, the information will be stored (operation 620). If the answer is no and the operation is to write a SET state into a memory bit in the same memory block, the lapse of time since the RESET reference time for this memory block will be compared to a preset time as shown in operation 616. If the time lapse is less than the preset time, the information will be stored (operation 622). If the time lapse is equal to or greater than the preset time, the information will be written into a memory bit in a different memory block for which the time lapse is less than the preset time (operation 618). With such method, the maximum amount of time during which $V_T$ of a RESET bit may drift (to a higher voltage) is limited to the preset time. The write access bias can be controlled and accidental turn-on of unselected bits during programming may be prevented.

Figure 7:
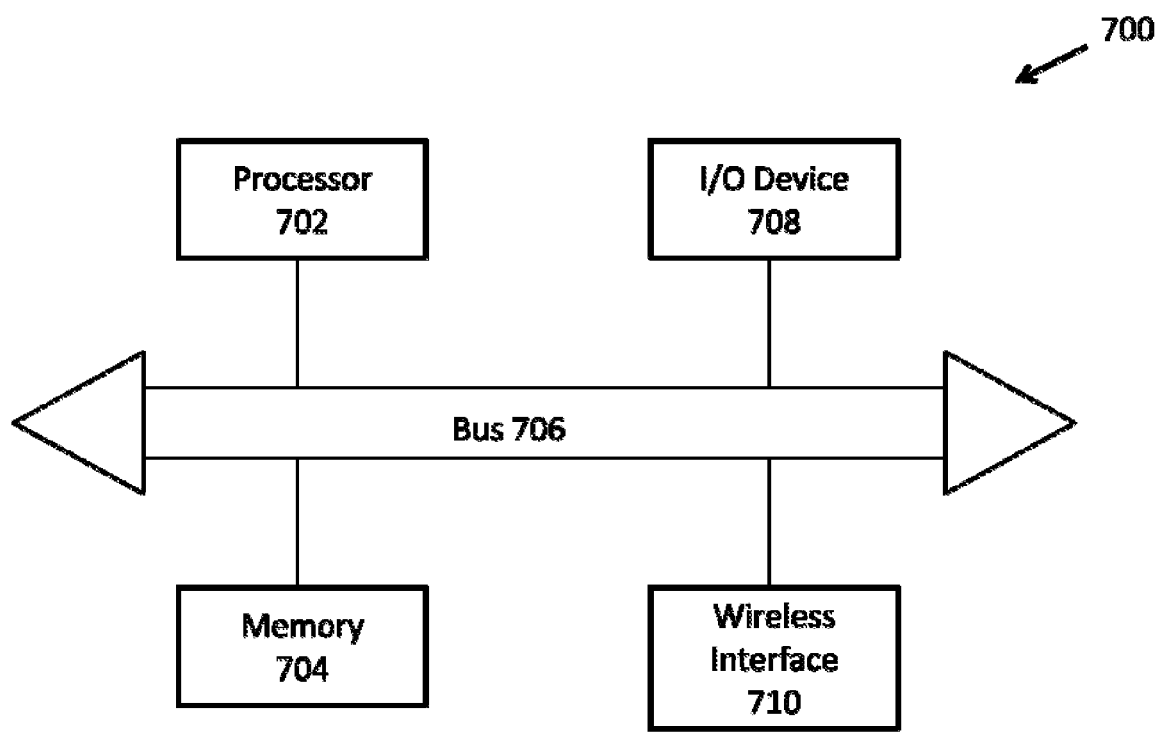
FIG. 7 is a schematic diagram of a system in accordance with one or more embodiments.

FIG. 7 illustrates an example of a microelectronic system 700 utilizing the subject matter of the present description. The microelectronic system 700 may be any electronic device, including but not limited to a portable device, such as a portable computer, a mobile telephone, a digital music player, a web tablet, a personal digital assistant, an instant messaging device, or other devices. The microelectronic system 700 may be adapted to transmit and/or receive information wirelessly, such as through a wireless local area network (WLAN) system, a wireless personal area network (WPAN) system, a cellular network and/or a wireless wide area network (WWAN).

The microelectronic system 700 may include a processor 702, a memory 704, an input/output (I/O) device 708 (e.g. a keypad, display, and the like), and a wireless interface 710 coupled to each other via a bus 706. It is understood that the scope of the claimed subject matter is not limited to embodiments having any or all of these components.

The processor 702 may comprise, for example, one or more microprocessors, digital signal processors, application specific integrated circuits, microcontrollers, or the like. The memory 704 may be used to store messages transmitted to or by system 700. The memory 704 may also optionally be used to store instructions that are executed by processor 702 during the operation of system 700, and may be used to store user data. The memory 704 may include at least one memory device comprising a PCMS memory cell and a memory controller that performs drift management to control temporal drift of PCM parameters as discussed herein.

The I/O device 708 may be used by a user to generate a message. The system 700 may use the wireless interface 710 to transmit and receive messages to and from a wireless communication network with a radio frequency (RF) signal. Examples of the wireless interface 710 may include an antenna or a wireless transceiver, although the scope of the claimed subject matter is not limited in this respect.

Having thus described in detail embodiments of the claimed subject matter, it is understood that the subject matter defined by the appended claims is not to be limited by particular details set forth in the above description, as many apparent variations thereof are possible without departing from the spirit or scope thereof.

What is claimed is:

1. A drift management method comprising:
   storing a time when a first memory state is written into a first memory bit in a first memory block of a memory device, the memory device having two or more memory blocks;
   before writing a second memory state into a memory bit in the first memory block after a time lapse since the first memory state is written, comparing the time lapse with a preset time; and
   writing the second memory state into a memory bit in a memory block different from the first memory block if the time lapse is equal to or greater than the preset time.

2. The method of claim 1, further comprising writing the second memory state into a memory bit in the first memory block if the time lapse is less than the preset time.

3. The method of claim 2, further comprising storing the second memory state in a buffer before writing the second memory state into a memory bit.

4. The method of claim 1, further comprising transferring the first memory state in the first memory bit into a memory bit in a memory block different from the first memory block if the time lapse is equal to or greater than the preset time.

5. The method of claim 1, wherein the first memory state is a SET state and the second memory state is a RESET state.

6. The method of claim 1, wherein the first memory state is a RESET state and the second memory state is a SET state.

7. The method of claim 1, wherein storing a time when a first memory state is written into a first memory bit of a memory device comprises storing a time when a SET or a RESET state is written into a first memory bit of a phase change memory and switch (PCMS) memory device.

8. The method of claim 1, wherein the memory device comprises a non-volatile memory.

9. A memory device, comprising:
   a phase change memory and switch (PCMS) memory cell; and
   a memory controller that is capable of implementing drift management to control drift of the PCMS memory cell wherein the memory controller is configured to determine whether to implement the drift management based on a comparison of a preset time with a lapse of time since a first memory state is written into a first memory bit, wherein, to control drift of the PCMS memory cell, the memory controller is configured to:
   store a time when the first memory state is written into the first memory bit in a first memory block of the memory device, the memory device having two or more memory blocks;
   before writing a second memory state into a memory bit in the first memory block after the time lapse since the first memory state is written, compare the time lapse with the preset time;
   write the second memory state into a memory bit in a memory block different from the first memory block if the time lapse is equal to or greater than the preset time; and
   write the second memory state into a memory bit in the first memory block if the time lapse is less than the preset time.

10. The memory device of claim 9, wherein the PCMS memory cell comprises a chalcogenide material, an Ovonic material, or combinations thereof.

11. The memory device of claim 9, wherein the memory device comprises a non-volatile memory.

12. The memory device of claim 9, wherein said memory controller is further configured to store the second memory state in a buffer before writing the second memory state into a memory bit.

13. The memory device of claim 9, wherein said memory controller is further configured to transfer the first memory state in the first memory bit into a memory bit in a memory block different from the first memory block if the time lapse is equal to or greater than the preset time.

14. A system, comprising:
   a processor; and
   a memory device coupled to the processor, the memory device comprising a phase change memory and switch (PCMS) memory cell and a memory controller that is configured to determine whether to control drift of the phase change memory and switch (PCMS) memory cell based on a time lapse since a first memory state was written into a first memory bit, wherein said memory controller is configured to:
   store a time when the first memory state is written into the first memory bit in a first memory block of the memory device, the memory device having two or more memory blocks;
   before writing a second memory state into a memory bit in the first memory block after the time lapse since the first memory state is written, compare the time lapse with a preset time;
   write the second memory state into a memory bit in a memory block different from the first memory block if the time lapse is equal to or greater than the preset time; and
   write the second memory state into a memory bit in the first memory block if the time lapse is less than the preset time.

15. The system of claim 14, wherein the processor comprises a microprocessor, a digital signal processor, an application-specific integrated circuit, a microcontroller, or combinations thereof.

16. The system of claim 14, further comprising an input/output device and a wireless interface coupled to the processor.

17. The system of claim 14, wherein the PCMS memory cell comprises a chalcogenide material, an Ovonic material, or combinations thereof.

18. The system of claim 14, wherein the memory device comprises a non-volatile memory.

* * * * *